United States Patent [19]
Tobita et al.

[11] Patent Number: 5,523,977
[45] Date of Patent: Jun. 4, 1996

[54] TESTING SEMICONDUCTOR MEMORY DEVICE HAVING TEST CIRCUIT

[75] Inventors: Youichi Tobita; Yasuji Nagayama, both of Hyogo, Japan

[73] Assignee: Mitsubishi Denki Kabushiki Kaisha, Tokyo, Japan

[21] Appl. No.: 62,493

[22] Filed: May 18, 1993

Related U.S. Application Data

[63] Continuation of Ser. No. 543,864, Jun. 26, 1990, abandoned.

[30] Foreign Application Priority Data

Jul. 13, 1989 [JP] Japan .................................. 1-180967

[51] Int. Cl.⁶ .............................. G11C 7/00; G11C 29/00
[52] U.S. Cl. .............................................................. 365/201
[58] Field of Search ................................. 371/21.4, 21.1, 371/15.1; 365/200, 201; 324/73.1

[56] References Cited

U.S. PATENT DOCUMENTS

| | | | |
|---|---|---|---|
| 4,553,225 | 11/1985 | Ohe | 371/21.4 |
| 4,806,788 | 2/1989 | Tobita | 307/296 R |
| 4,841,233 | 6/1989 | Yoshida | 371/21.4 |
| 4,860,259 | 8/1989 | Tobita | 365/201 |
| 4,879,689 | 11/1989 | Atsumi et al. | 365/201 |
| 4,991,139 | 2/1991 | Takahashi et al. | 365/201 |
| 5,051,995 | 9/1991 | Tobita | 371/21.4 |

FOREIGN PATENT DOCUMENTS 64-59696 of 1989 Japan.

OTHER PUBLICATIONS

McAdams et al., "A 1-Mbit CMOS Dynamic RAM with Design-For Test Functions", *IEEE Journal of Solid-State Circuits*, vol. SC-21, No. 5 (Oct., 1986), pp. 635-642.

*Primary Examiner*—Robert W. Beausoliel, Jr.
*Attorney, Agent, or Firm*—Lowe, Price, LeBlanc & Becker

[57] ABSTRACT

A semiconductor memory device having a test circuit includes voltage detection circuits (120, 220) for detecting a test mode when a voltage higher than a normal use voltage is applied to a terminal (101, 201). When one voltage detection circuit (120) detects a test mode, a voltage switching circuit (130) renders a MOS transistor (111) conductive, a resistance (115) connected in parallel to the MOS transistor is short-circuited and a voltage lower than (½·Vcc) is applied to a bit line voltage supply line (9). Alternatively, when the other voltage detection circuit (220) detects the test mode, a voltage switching circuit (230) renders a MOS transistor (211) conductive, a resistance (114) connected in parallel to the MOS transistor is short-circuited, and a voltage higher than (½·Vcc) is applied to the bit line voltage supply line. Thus, by applying a voltage higher or lower than that for normal use on a bit line, a memory cell having a small margin can be tested in a short period of time.

13 Claims, 10 Drawing Sheets

FIG.16 PRIOR ART

| CELL PLATE POTENTIAL \ CELL DATA | "0" | "1" |
|---|---|---|
| Vcc | $-\dfrac{1}{2} \cdot \dfrac{C_6}{C_{13}+C_6}(V_{CC}-\Delta V)$ | $\dfrac{1}{2} \cdot \dfrac{C_6}{C_{13}+C_6}(V_{CC}+\Delta V)$ |
| FIXED | $-\dfrac{1}{2} \cdot \dfrac{C_6}{C_{13}+C_6}(V_{CC}+\Delta V)$ | $\dfrac{1}{2} \cdot \dfrac{C_6}{C_{13}+C_6}(V_{CC}-\Delta V)$ |
| $\dfrac{1}{2} V_{CC}$ | $-\dfrac{1}{2} \cdot \dfrac{C_6}{C_{13}+C_6} V_{CC}$ | $\dfrac{1}{2} \cdot \dfrac{C_6}{C_{13}+C_6} V_{CC}$ |

5,523,977

TESTING SEMICONDUCTOR MEMORY DEVICE HAVING TEST CIRCUIT

This application is a continuation of application Ser. No. 07/543,864 filed Jun. 26, 1990, now abandoned.

BACKGROUND OF THE INVENTION

1. Field of the Invention

The present invention relates generally to testing semiconductor memory devices, and more particularly, to a semiconductor memory device having on-chip test circuit for testing one transistor and one capacitor type memories.

2. Description of the Background Art

Due to the development of the manufacturing technique of semiconductor integrated circuits and to the user's request on cost reduction, the degree of integration of a DRAM is increased quadruple in about three years, and today DRAMs having a capacity of 4M bits have come into use. In such a DRAM, for example, a data read/write test is carried out wherein when data "0" are written in all the memory cells, the data "0" are read out from all the memory cells, and the same operation is performed with respect to the data "1" in the cycle time of 10 μsec. (maximum pulse width of a RAS (row address strobe) signal), the test time T1 for testing will be represented by the following equation (1).

$$T1 = 4 \text{ (writing of "0"} > \text{reading of "0"} > \text{writing of "1"} > \text{reading of "1"}) \times 4 \times 10^6 \text{ (memory capacity)} \times 10 \text{ μsec (cycle time)} = 160 \text{ sec} \quad (1)$$

In case of a conventional dynamic RAM, the data read/write test should be performed at least under four different conditions, namely, at the maximum value 5.5 V and the minimum value 4.5 V of the operational range of a power supply voltage, and at the higher temperature 70° C. and the lower temperature 0° C. of the operational temperature range.

In this case, the test time T2 for testing will be represented by the equation (2).

$$T2 = 160 \text{ sec.} \times 4 = 640 \text{ sec.} \quad (2)$$

The above described value is extremely large as a test time for an integrated circuit, which causes reduction of the productivity and the increase in cost.

In addition, the above described test is not sufficient for detecting defects in some cases. Other test should be performed by combining timings of input signals, addressing order of address signals, patterns of data to be written in the memory cells, and so on. Such combination test requires a long period of time.

In testing a memory cell, it is to important to read the voltage from the memory cell. Assuming that when a voltage of 100 mV or more is read as data from the memory cell, the memory cell operates normally, if a voltage of 200 mV is read from a memory cell, it is determined that the memory cell is good because it has an operation margin of 100 mV for the voltage of 100 mV. However, in case a voltage of 110 mV is read from a memory cell, an operation margin is as small as 10 mV for the voltage of 100 mV. A voltage read from a memory cell varies depending on the conditions, so that there are cases in which a voltage of only 90 mV is read from a memory cell outputting a voltage of 110 mV.

More specifically, since the bit lines are adjacent to each other, as a memory capacitance is increased, there appears a capacitance between the bit lines, whereby a coupling capacitance is changed depending on whether the adjacent bit lines are of "1" or "0", so that a voltage read from the memory cell becomes 90 mV or 110 mV. Therefore, if a memory cell which read voltage is 110 mV is good, the memory cell is considered to be defective depending on the conditions of the usage.

A power supply voltage fluctuation test (referred to as V bump test hereinafter) has been employed, by which operation margins of memory cells can be tested in a short period of time, considering that almost all the memory cells malfunction in the combination test have small operation margins. The V bump test is a testing of a memory cell based on the fact that fluctuation of a power supply voltage, a V bump, reduces a reading margin and increases an access time period. The V bump is divided into a Vcc bump which is a fluctuation of a power supply voltage and a $V_{BB}$ bump which is a fluctuation of a substrate voltage. The Vcc bump has two types based on a direction of the bump, one of which is referred to as a positive Vcc bump in which after data is written in a memory cell with a low power supply voltage Vcc, if the data is read from the memory cell with a high power supply voltage Vcc, a reading margin of the memory cell is reduced and even an error is caused. The other is a mode referred to as a negative Vcc bump which is further divided into modes wherein after data is written with a high power supply voltage Vcc, if the data is read with a low power supply voltage Vcc, an access time is delayed in one mode and an erroneous operation is caused in the other. The $V_{BB}$ bump is a problem peculiar to a dynamic RAM containing a substrate voltage generating circuit, and which fluctuation reduces a reading margin of a memory cell. However, as the memory capacity becomes larger and larger, the effect of the V bump test has been lost. The reason for this will be described in the following with reference to FIGS. 10 to 14.

FIG. 11 is a block diagram showing a schematic structure of an entire reading portion of a DRAM to which the present invention is applied.

In FIG. 11, the DRAM comprises a memory cell array MA, an address buffer AB, an X decoder ADX, a Y decoder ADY, a sense amplifier and I/O SI and an output buffer OB. The memory cell array MA comprises a plurality of memory cells arranged in rows and columns for storing information, and the address buffer AB receives external address signals applied from an exterior to generate internal address signals. The X decoder ADX decodes the internal address signals applied from the address buffer AB to select a corresponding row in the memory cell array. The Y decoder ADY decodes internal column address signals applied from the address buffer AB to select a corresponding column in the memory cell array MA.

The sense amplifier and I/O SI detects and amplifies information stored in the selected memory cell in the memory cell array MA, and outputs the information as read data to the output buffer OB in response to a signal from the Y decoder ADY. The output buffer OB receives the read data to output the output data Dout to the exterior. A control signal generating system CG is provided as a peripheral circuit for generating control signals for controlling timings of various operations of the DRAM.

FIG. 12 is a diagram showing a schematic structure of the memory cell array shown in FIG. 11.

In FIG. 12, the memory cell (array MA) comprises a plurality of word lines WL1, WL2, ..., WLn and a plurality of bit lines BL0, $\overline{BL0}$, BL1, $\overline{BL1}$, ..., BLm, $\overline{BLm}$. Each of the word lines WL1, ..., WLn is connected to one row of the memory cells. The bit lines are formed as a folded bit line type, in which two bit lines constitute a bit line pair. Namely, the bit lines BL0 and $\overline{BL0}$ constitute one bit line pair, the bit lines BL1 and $\overline{BL1}$ constitute one bit line pair and the bit lines BLm and $\overline{BLm}$ constitute one bit line pair, in the same manner.

Memory cells 1 are connected to intersections of the respective bit lines BL0, $\overline{BL0}$, . . . , BLm, $\overline{BLm}$ and every other word lines. Namely, a memory cell is connected to an intersection of one word line and either of the paired bit lines. A precharging/equalizing circuit 150 for equalizing potentials of each bit line pair and precharging the same to a predetermined potential $V_B$ is provided at each bit line pair. A sense amplifier 50 is provided for each bit line pair, which is activated in response to signals $\phi_A$ and $\phi_B$ transmitted on signal lines 20 and 30, for detecting and differentially amplifying the potential difference between the bit line pair. Each bit line is selectively connected to data input/output buses I/O, $\overline{I/O}$ in response to an address decode signal from the Y decoder ADY. Namely, the bit lines BL0 and $\overline{BL0}$ are connected to the data input/output buses I/O and $\overline{I/O}$ through transfer gates T0 and T0', respectively.

In the same manner, the bit lines BL1 and $\overline{BL1}$ are connected to the data input/output buses I/O and $\overline{I/O}$ through transfer gates T1 and and T1', respectively, and the bit lines BLm and $\overline{BLm}$ are connected to the data input/output buses I/O and $\overline{I/O}$ through transfer gates Tm and Tm', respectively. The address decode signals from the Y decoder ADY are transmitted to gates of the respective transfer gates T0, T0', . . . , Tm, Tm'. Thus, a pair of bit lines is connected to the data input/output buses I/O and $\overline{I/O}$.

FIG. 13 is a diagram showing a detailed structure of one of the bit line pairs shown in FIG. 12. In FIG. 13, only one word line and one bit line pair are shown for the purpose of simplicity.

In FIG. 13, a precharging/equalizing circuit 150 is provided for precharging a pair of bit lines 2 and 7 to a predetermined potential $V_B$ when the memory is on standby and for equalizing potentials of the bit lines 2 and 7 to predetermined potentials. The precharging/equalizing circuit 150 comprises n channel MOS transistors 10 and 11 responsive to a precharging signal $\phi_P$ generated by control generating system CG in FIG. 11 for electrically connecting the bit lines 2 and 7 by transmitting predetermined perchance potentials to the bit lines 2 and 7, respectively, and for equalizing the potential of the bit lines 2 and 7 at the precharge potential. Both of the n channel MOS transistors 10 and 11 are rendered conductive in response to the precharging signal $\phi_P$ applied through a signal line 12 and apply the precharge potential $V_B$ transmitted on a signal line 9 to the bit lines 2 and 7.

The memory cell 1 comprises a transfer gate 5 formed of an n channel insulated gate field effect transistor, and a capacitance 6. The transfer gate 5 has a gate connected to a word line 3 and a source connected to the bit line 2. The capacitance 6 is connected to a drain of the transfer gate 5 through a node 4, where the data of the memory cell 1 is stored. The node 4 forms a so-called storage node.

When the word line 3 is selected, a word line driving signal Rn is transmitted to the transfer gate 5 to render the same conductive, whereby the information stored in the memory cell 1 is transferred onto the bit line 2. Memory cells 1 (only one cell is shown) are connected to the bit line 7, while no memory cell is connected to an intersection of the word line 3 and the bit line 7. Therefore, when the memory cell 1 shown in FIG. 12 is selected, the bit line 7 applies a reference potential for the bit line 2. The bit lines 2 and 7 form parasitic capacitances 13 and 14, respectively.

The area of the memory cell has been made smaller and the capacity of the memory cell has also been made smaller as a degree of integration (memory capacitance) has been increased. However, in order to prevent malfunctions (soft errors) of a DRAM due to α rays emitted from an package of the DRAM, a memory cell capacitance value of at least about 50 fF is generally required. Therefore, it is a general practice to compensate for the reduction of a memory cell capacitance due to the reduction of the memory cell area by reducing the film thickness of the dielectric. However, when the film thickness of the dielectric is reduced, the electric field applied into the insulating film becomes strong, causing possible breakdown of the insulating film and lowering the reliability of the DRAM. This problem has become acute especially by 1M bit DRAMs used at present. In order to cope with the problem, it has become a common practice to supply a voltage of half the power supply voltage divided by the resistances 17 and 18 to an electrode on the power supply side (referred to as a cell plate electrode hereinafter) of the memory cell capacitance, as shown in FIG. 13. Resistances 17 and 18 forming a constant voltage generating circuit are connected in series between a power supply 16 and a ground, and a constant voltage defined by resistance division is generated at a node of the resistances 17 and 18. The resistance values of the resistances 17 and 18 are selected such that a level of the voltage is half the general power supply voltage. An output voltage of the constant voltage generating circuit is applied to one electrode of the capacitance 6 through a signal line 8. The capacitance 6 is formed of parallel plate electrodes with the dielectric being a thin insulating film such as a single layer silicon oxide or a multi-layered film of silicon oxide and silicon nitride, and a size thereof is dependent on an area of the memory cell. This approach is disclosed in Japanese Patent Publication No. 60-50065 (U.S. Ser. No. 722,841). According to the Japanese Patent Publication, the electric field is determined by a voltage difference between the storage node 4 and the cell plate electrode, and since the voltage of the cell plate becomes an intermediate value between the data "1" and "0", the electric field is reduced by half.

However, the application of the voltage half as large as the power supply voltage to the cell plate electrode makes it difficult to detect memory cells having small operation margins in the V bump test. The reasons will be described in the following.

In the DRAMs having a capacity of less than 1M bits, an insulating film constituting a dielectric of a memory cell capacitance is relatively thick (about 150 Å–200 Å in a DRAM of 256 k bits), and therefore there has been little need to set the voltage of the cell plate electrode at ½ Vcc. As a result, a voltage of Vcc or 0 level is supplied from a power supply line or from a ground line which has small impedance and therefore little noise. The constant voltage generating circuit shown in FIG. 13 has relatively high impedance and is liable to generate noise during the operation of the DRAM which reduces operation margin thereof, and therefore it has not been used.

The effects of the V bump test in case where levels of the cell plate electrode are the power supply voltage Vcc, ground (fixed level) and Vcc/2, respectively, will be compared in the following.

(1) The level of the cell plate electrode is power supply voltage Vcc: (in case the signal line 8 shown in FIG. 13 is connected to Vcc as shown by the dotted line)

Voltage waveforms of respective nodes concerned in the V bump test are shown in FIGS. 14 and 15. The V bump test is carried out by writing data in the memory cell 1 with a certain supply voltage Vcc, raising the power supply voltage Vcc by a certain level as shown in FIG. 14 (a), and thereafter by reading the data from the memory cell 1. In FIG. 14, the data is written with the power supply voltage Vcc and the data is read with the voltage Vcc+ΔV. The precharge potential $V_B$ is set at a value equal to half the power supply voltage Vcc, which is as shown in FIG. 14(b). The storage node 4 is at 0 V in writing since it is assumed that the data "0" is written in the storage node 4. Now assuming that because of the connection of the storage node 4 to the signal line 8 through the capacitance, a voltage of the storage node 4 rises by the amount of fluctuation when the power supply voltage of the signal line 8 fluctuates, as shown in FIG. 14(c). At this time, the levels of the bit lines 2 and 7 change with the precharge potential $V_B$ to be approximately the same level as the precharge potential $V_B$.

An operation of reading data from the memory cell 1 will be described in the following with reference to FIG. 15. As shown in FIG. 14(a), when the precharge signal $\phi_P$ goes low level at the time $t_0$, the signal line 9 and the bit lines 2 and 7 are non-equalized from each other. When the word line driving signal Rn rises at the time $t_1$ as shown in FIG. 15(b), the MOS transistor 5 is rendered conductive, a current flows from the bit line having a higher potential to the storage node 4, whereby the potential on the bit line 2 drops as shown in FIG. 15(c) and the potential on the storage node 4 rises as shown in FIG. 15(d). At the time $t_2$ the potentials almost do not change, so that the reading levels on the bit lines 2 and 7 are set. The levels on the bit lines 2 and 7 on this occasion will be represented by the following equations.

Considering that a principle of the conservation of electric charges is established between the bit line 2 and the storage node 4 before and after the conduction of the MOS transistor 5, the following equation will be obtained:

$$\tfrac{1}{2}\cdot(Vcc+\Delta V)\cdot C_{13}+\Delta V\cdot C_6=(C_{13}+C_6)\cdot V_{BO} \tag{3}$$

$$V_{BO}=1/(C_{13}+C_6)\cdot[\tfrac{1}{2}\cdot(Vcc+\Delta V)\cdot C_{13}+\Delta V\cdot C_6] \tag{4}$$

wherein $V_{BO}$ denotes a bit line voltage on a reading side when "0" is read after the V bump test.

A voltage difference VSO with the bit line 7 will be represented by the following equation:

$$V_{SO}=1/(C_{13}+C_6)\cdot[\tfrac{1}{2}\cdot(Vcc+\Delta V)\cdot C_{13}+V\cdot C_6]-\tfrac{1}{2}\cdot(Vcc+\Delta V) \tag{5}$$

$$=-\tfrac{1}{2}\cdot C_6/(C_{13}+C_6)\cdot(V_{cc}+\Delta V) \tag{6}$$

wherein $V_{SO}$ denotes a voltage obtained by subtracting a voltage on the other side from $V_{BO}$.

Accordingly, the voltage difference becomes smaller by the amount of ΔV, producing the V bump effect.

(2) The level is fixed (in case the cell plate voltage is fixed with respect to the Vcc fluctuation, namely, the signal line 8 is grounded as shown by the dotted line):

When the data "0" is written in the memory cell 1, the following equations will be obtained.

$$\tfrac{1}{2}\cdot(Vcc+\Delta V)\cdot C_{13}=(C_{13}+C_6)\cdot V_{BO} \tag{7}$$

$$V_{BO}=1/(C_{13}+C_6[\tfrac{1}{2}\cdot(Vcc+\Delta V)\cdot C_{13}] \tag{8}$$

$$V_{SO}=1/(C_{13}+C_6)[\tfrac{1}{2}\cdot(Vcc+\Delta V)\cdot C_{13}]-\tfrac{1}{2}\cdot(Vcc+\Delta V) \tag{9}$$

$$V_{SO}=-\tfrac{1}{2}\cdot C_6/(C_{13}+C_6)\cdot(Vcc+\Delta V) \tag{10}$$

For the data "0", the V bump produces a reverse effect, to enlarge the voltage difference. When the data "1" is written in the memory cell 1, the following equations will be obtained.

$$\tfrac{1}{2}\cdot(Vcc+\Delta V)\cdot C_{13}+(Vcc+\Delta V)\ C_6=(C_{13}+C_6)V_{B1} \tag{11}$$

$$V_{B1}=1/(c_{13}+C_6)\cdot[\tfrac{1}{2}(Vcc+\Delta V)\cdot C_{13}+(Vcc+\Delta V)\cdot C_6] \tag{12}$$

$$V_{S1}=\tfrac{1}{2}\cdot C_6/(C_{13}+C_6)\cdot(Vcc-\Delta V) \tag{13}$$

For the data "1", the voltage difference becomes smaller, and therefore, there occurs V bump effect.

(3) The level is ½ Vcc (in case the signal line 8 is connected between the resistances 17 and 18 in FIG. 13):

In this case, a voltage level of the cell plate electrode changes only by ½·ΔV, so that the level on the storage node 4 of the memory cell 1 will change also by ½·ΔV. Calculating in the same manner as the above description, the following equations will be obtained, $$\tfrac{1}{2}\cdot(Vcc+\Delta V)\cdot C_{13}+\tfrac{1}{2}\cdot\Delta V\cdot C_6=(C_{13}+C_6)\cdot V_{BO} \tag{14}$$

$$V_{BO}=1/(C_{13}+C_6[\tfrac{1}{2}\cdot(Vcc+\Delta V)\cdot C_{13}+\tfrac{1}{2}\cdot\Delta V\cdot C_6] \tag{15}$$

$$\begin{aligned}V_{SO}&=1/(C_{13}+C_6)[1/2\cdot(Vcc+\Delta V)\cdot C_{13}+1/2\cdot\Delta V\cdot C_6]-1/2\cdot(Vcc+\Delta V)\\&=-1/2\cdot C_6/(C_{13}+C_6)\cdot Vcc\end{aligned}$$

wherein there is no term ΔV included, and therefore there occurs no V bump effect.

When the data "1" is written in the memory cell, the following equations will be obtained, $$\tfrac{1}{2}\cdot(Vcc+\Delta V)\cdot C_{13}+(Vcc+\tfrac{1}{2}\cdot\Delta V)\cdot C_6=(C_{13}+C_6)\cdot V_{B1} \tag{18}$$

$$V_{B1}=1/(C_{13}+C_6)[\tfrac{1}{2}\cdot(Vcc+\Delta V)\cdot C_{13}+(Vcc+\tfrac{1}{2}\cdot\Delta V)\cdot C_6 \tag{19}$$

$$\begin{aligned}V_{S1}&=1/(C_{13}+C_6)[1/2\cdot(Vcc+\Delta V)\cdot C_{13}+\\&\quad(Vcc+1/2\cdot\Delta V)\cdot C_6\\&=1/2\cdot C_6/(C_{13}+C_6)\cdot Vcc\end{aligned} \tag{20}$$

$$\tag{21}$$

wherein there is no term ΔV included, and therefore, there occurs no V bump effect.

FIG. 16 shows the above described relations.

From the above described results, it is found that a reading margin of a memory cell will be different in case of the cell plate voltage being Vcc or fixed, and in case of ½·Vcc. More specifically, when the cell plate voltage is Vcc or it is fixed, a voltage difference between a pair of bit lines, that is, a voltage difference between the inputs of the sense amplifier changes depending on ΔV, so that a reading margin of the memory cell can be tested by ΔV. However, when it is ½·Vcc, the input voltage difference of the sense amplifiers cannot be changed depending on ΔV, and therefore the reading margin of the memory cell cannot be tested by using ΔV.

SUMMARY OF THE INVENTION

Therefore, an object of the present invention is to test a semiconductor memory device having small operation margins can be tested in a short period of time.

Another object of the present invention is to test a semiconductor memory device by reducing voltage differences of sense amplifiers thereof without fluctuating power supply voltage.

Another object of the present invention is to provide on-chip testing for semiconductor memory device without increasing the number of terminals.

Briefly, according to the present invention, in a semiconductor memory device comprising a plurality of memory cells having one insulated gate filed effect transistor and one capacitance, a voltage generating circuit is connected to a bit line connected to one electrode of the insulated gate field effect transistor and a test mode is detected by a test mode detection circuit in response to a signal applied to an arbitrary terminal. In response to a detection of the test mode, a first voltage lower than a voltage applied in a normal use and a second voltage higher than the first voltage are switched to be generated from a voltage generating circuit and applied to the bit lines.

Therefore, according to the present invention, in a test mode of the memory cell, the first voltage lower than a voltage of a normal use and the second voltage higher than the first voltage are applied to the bit lines, so that the memory cells having smaller margins can be tested in a short period of time.

In a preferred embodiment of the present invention, a test mode is detected responsive to a voltage higher than a voltage of a normal use being applied to each terminal, or a control signal being inputted at a different timing from that of a normal use, or a signal being inputted at a different timing from that of a normal use and a voltage higher than a voltage of a normal use being applied to other terminals.

Accordingly, according to a preferred embodiment of the present invention, a test mode can be set by using a terminal to which a control signal for writing or reading data to a memory cell is inputted, so that there will be no need for providing additional terminals for setting a test mode.

In addition, a first resistance is connected between a first reference potential and a bit line, a second resistance is connected between a bit line and a second reference potential, a first switching element is connected in parallel to the first resistance, and a second switching element is connected in parallel to the second resistance. A second voltage higher than a voltage of a normal use is generated in response to a conduction of the first switching element in a test mode, and a first voltage lower than a voltage of a normal use is generated and applied to the bit line in response to a conduction of the second switching element.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a diagram showing various levels of voltage supplies.

DESCRIPTION OF THE PREFERRED EMBODIMENTS

Figure 1:
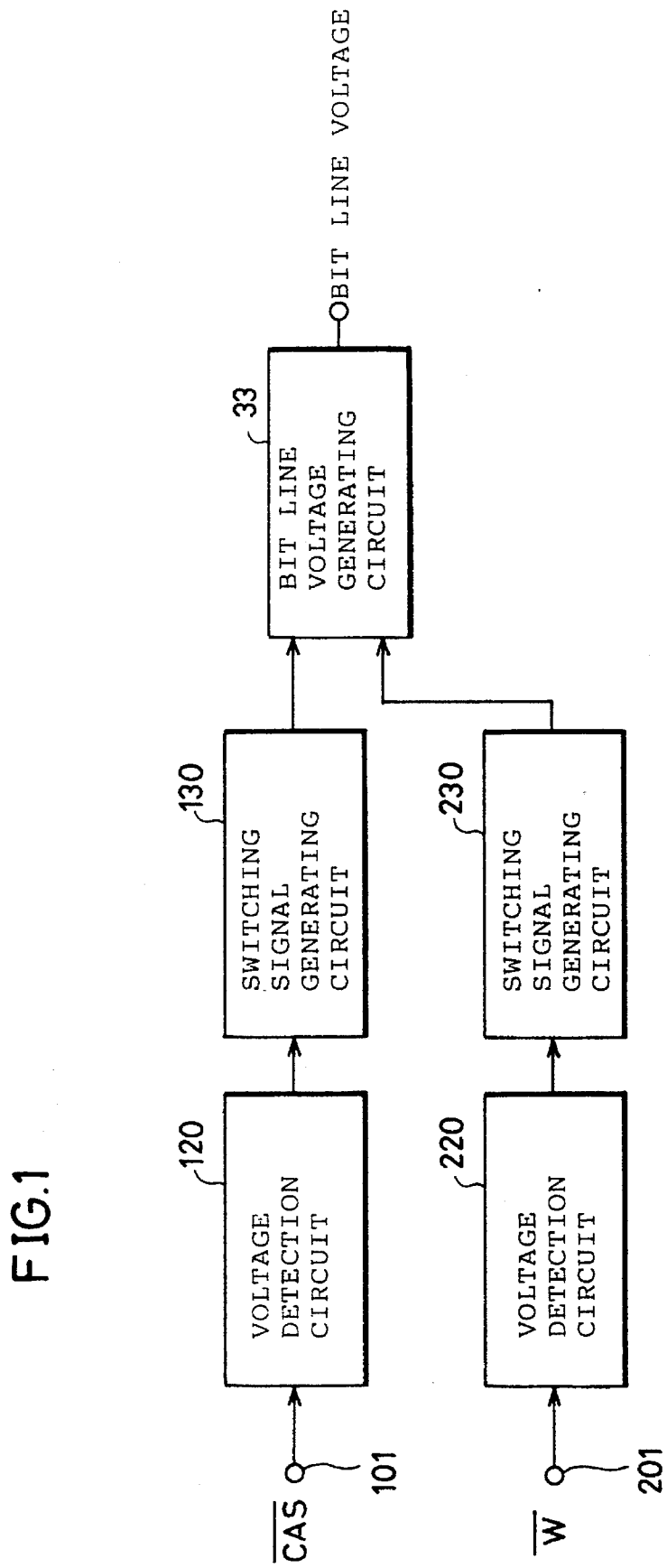
FIG. 1 is a schematic block diagram of one embodiment of the present invention.

First, prior to a description of the embodiments of the present invention, a principle of the present invention will be described. Now consider a case where a potential on a bit line is ½ Vcc in FIG. 13. Assuming that data "0" is stored in the memory cell 1, a potential level of the node 4 is at 0 V. In this state, when the memory cell 1 is selected and a potential level of the word line 3 is raised, the transistor 5 is rendered conductive and the contents of the memory cell is read out onto the bit line 2. In this case, a voltage of the bit line 2 will be as follows. Namely, before and after the reading, since the amount of electric charges of the bit line 2 and the memory cell 1 do not change, the following equation (22) will be obtained, $$\tfrac{1}{2} \cdot Vcc \cdot C_{13} = V_2(C_{13} + C_6) \qquad (22)$$

wherein $V_2$ is a potential on the bit line 2 after the reading and derived from the equation (22), it will be represented by the following equation (23).

$$V_2 = \tfrac{1}{2} \cdot Vcc \times C_{13}/(C_{13} + C_6) \qquad (23)$$

On the other hand, a potential $V_7$ on the bit line 7 does not change, so that the following equation (24) will be obtained.

$$V_7 = \tfrac{1}{2} Vcc \qquad (24)$$

An input potential difference $V_{SO}$ of the sense amplifier 50 will be represented by the equation (25).

$$|V_{SO}| = |V_2 - V_7| \qquad (25)$$
$$= 1/2 \cdot Vcc \times C_6/(C_{13} + C_6)$$

In the same manner, when the memory cell 1 stores the data "1" (Vcc volt), a potential difference $V_{S1}$ between the bit lines 2 and 7 after the reading of the memory cell will be represented by the following equation (26).

$$|V_{S1}| = \tfrac{1}{2} \cdot Vcc \times C_{13}/(C_{13} + C_6) \qquad (26)$$

When the potential on the bit line 2 is made smaller than ½·Vcc by ΔV, the following equation will be obtained in the same manner as the above described calculation.

$$|V_{SO}'| = \tfrac{1}{2} \cdot Vcc \times C_{13}/(C_{13} + C_6) - \Delta V \cdot C_{13}/(C_{13} + C_6) \qquad (27)$$

$$|V_{S1}'| = \tfrac{1}{2} \cdot Vcc \times C_{13}/(C_{13} + C_6) - \Delta V \cdot C_{13}/(C_{13} + C_6) \qquad (28)$$

When the potential on the bit line 2 is made larger than ½·Vcc by ΔV, the following equations (29) and (30) will be obtained in the same manner.

$$|V_{SO}''| = \tfrac{1}{2} \cdot Vcc \times C_{13}/(C_{13} + C_6) - \Delta V \cdot C_{13}/(C_{13} + C_6) \qquad (29)$$

-continued $$|V_{S1}"| = \frac{1}{2} \cdot Vcc \times C_{13}/(C_{13} + C_6) - \Delta V \cdot C_{13}/(C_{13} + C_6) \quad (30)$$

Comparing the equations (25) and (26), and the equations (27) to (30), it is clear from the equations (27) and (30), that an input voltage difference of the sense amplifier 50 is smaller in case a potential on the bit line 2 is made larger or smaller by ΔV than in a case where a potential on the bit line 2 is ½·Vcc.

Most specifically, it is shown that when the potential on the bit line 2 is made smaller than ½·Vcc, an input voltage difference of a sense amplifier in the reading of the data "0" becomes small and when the potential on the bit line 2 is made larger than ½·Vcc, an input voltage difference of a sense amplifier becomes smaller in the reading of the data "1". The embodiments will be described in detail in the following.

Figure 13:
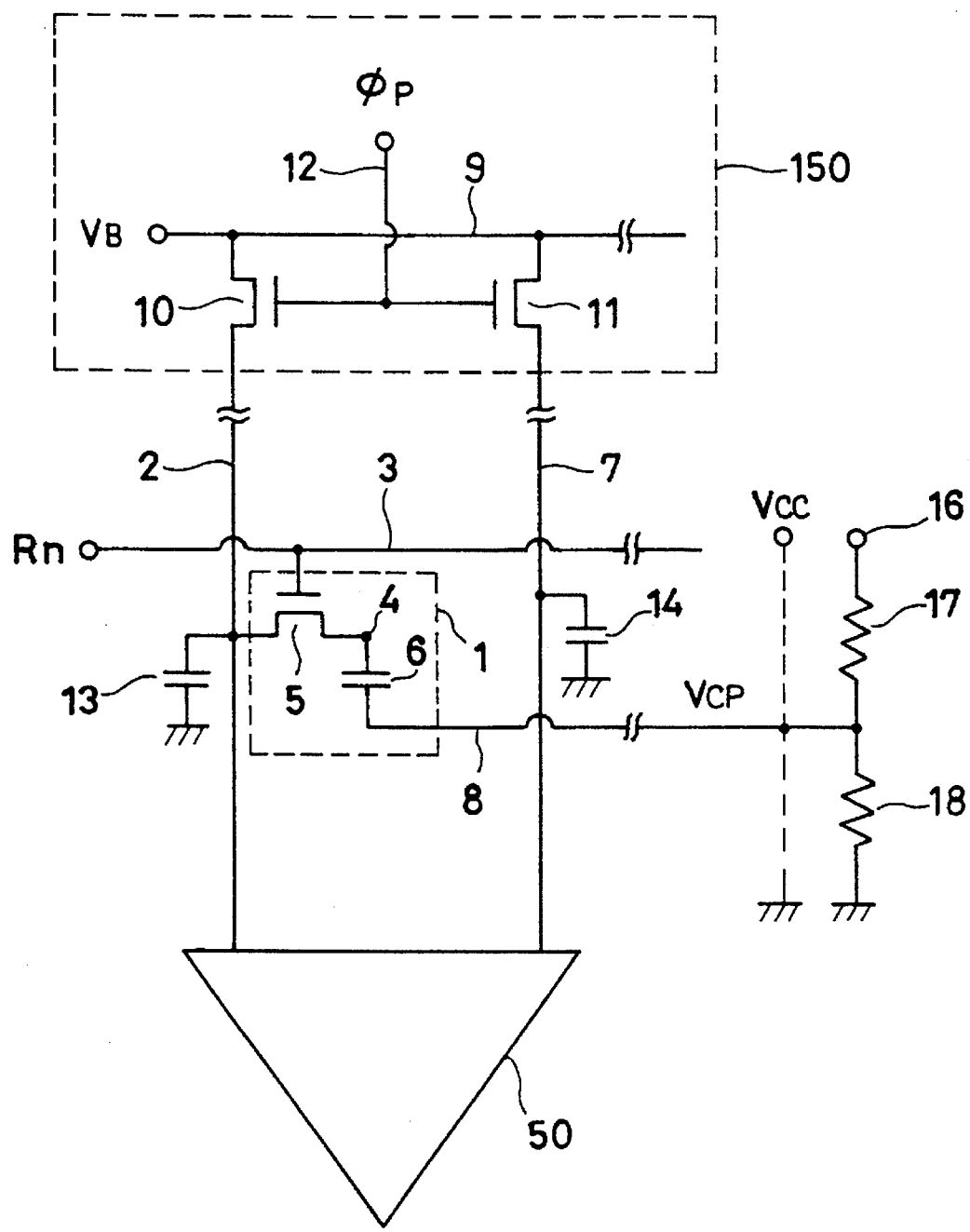
FIG. 13 is an electric circuit diagram showing a detailed structure of one of bit line pairs shown in FIG. 12.
Figure 14:
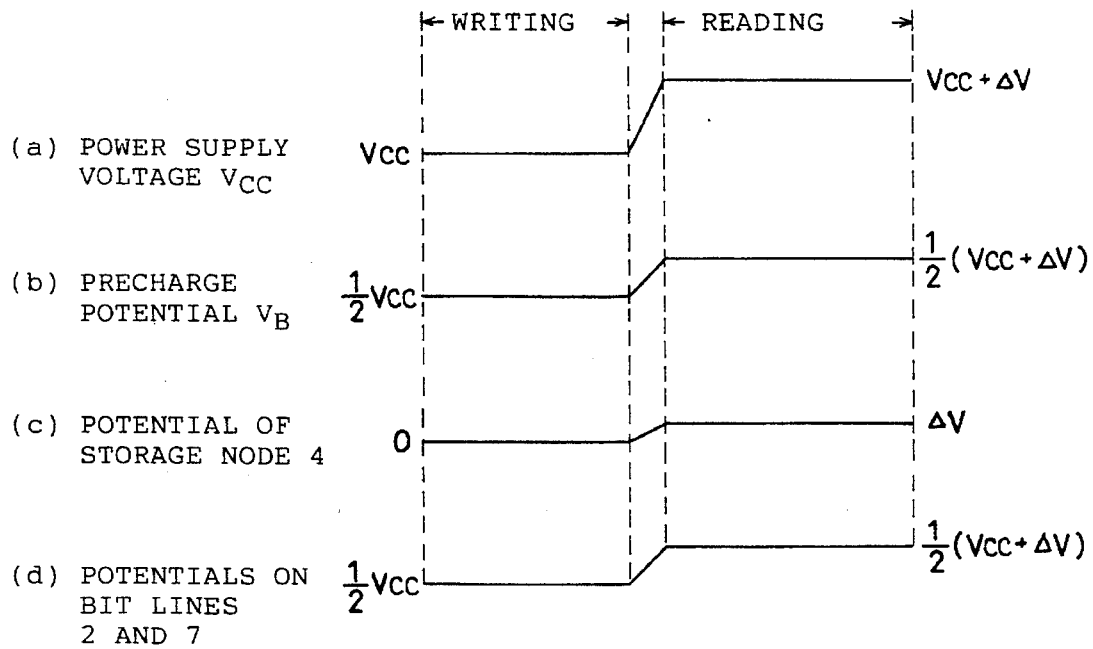
FIG. 14 and FIG. 15 are diagrams showing voltage waveforms of each node concerned in a test.
Figure 15:
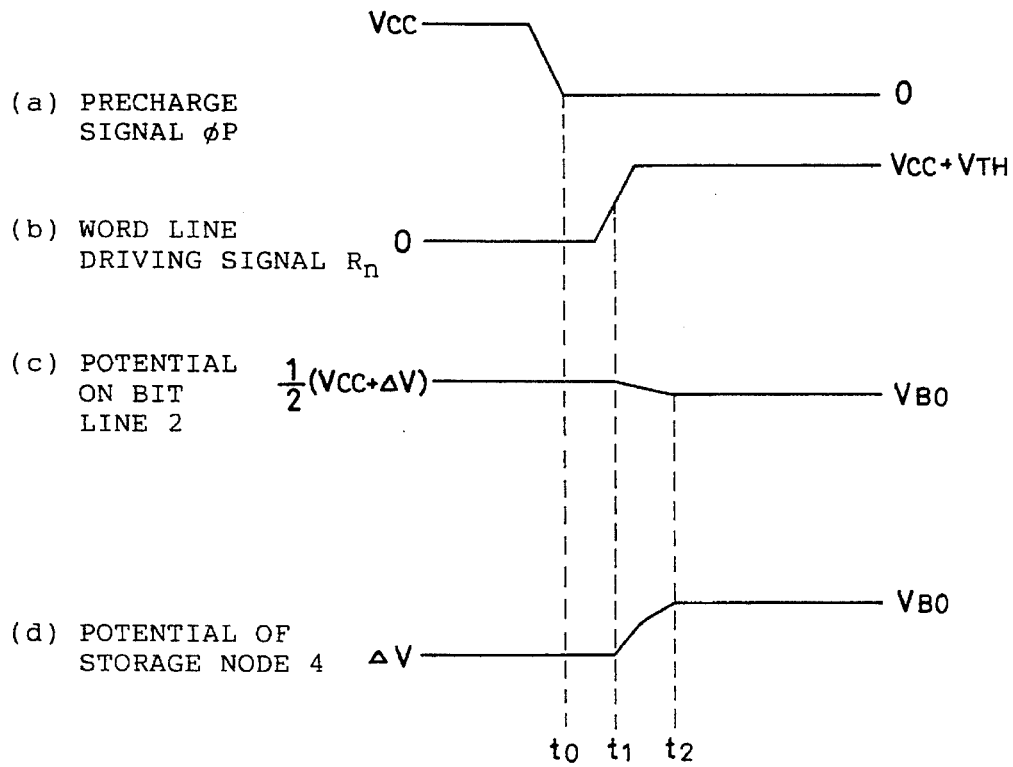

FIG. 1 is a schematic block diagram of one embodiment of the present invention. An input terminal 101 is supplied with an arbitrary external input signal (for example, $\overline{CAS}$ signal) of the DRAM. The external internal input signal is applied to a voltage detection circuit 120. The voltage detection circuit 120 detects the application of a voltage higher than a voltage of a signal for a normal use to the external input signal. The detection output of the voltage detection circuit 120 is applied to a voltage switching circuit 130. The voltage switching circuit 130 generates a bit line voltage having a value smaller than ½·Vcc from a bit line voltage generating circuit 33. The operation margin for the above-described data "0" of the memory cell 1 shown in FIG. 13 is checked by the bit line voltage.

An input terminal 201 is supplied with an external input signal (for example, $\overline{W}$ signal) of the DRAM. The external input signal is applied to a voltage detection circuit 220. The voltage detection circuit 220 detects the application of a voltage higher than a voltage of a signal for a normal use to the external input signal. The detection output of the voltage detection circuit 220 is applied to a voltage switching circuit 230. The voltage switching circuit 230 generates a bit line voltage having a value higher than ½·Vcc from the bit line voltage generating circuit 33 in response to the detection output of the voltage detection circuit 220. The operation margin of the data "1" of the memory cell 1 is checked by the bit line voltage.

Figure 2:
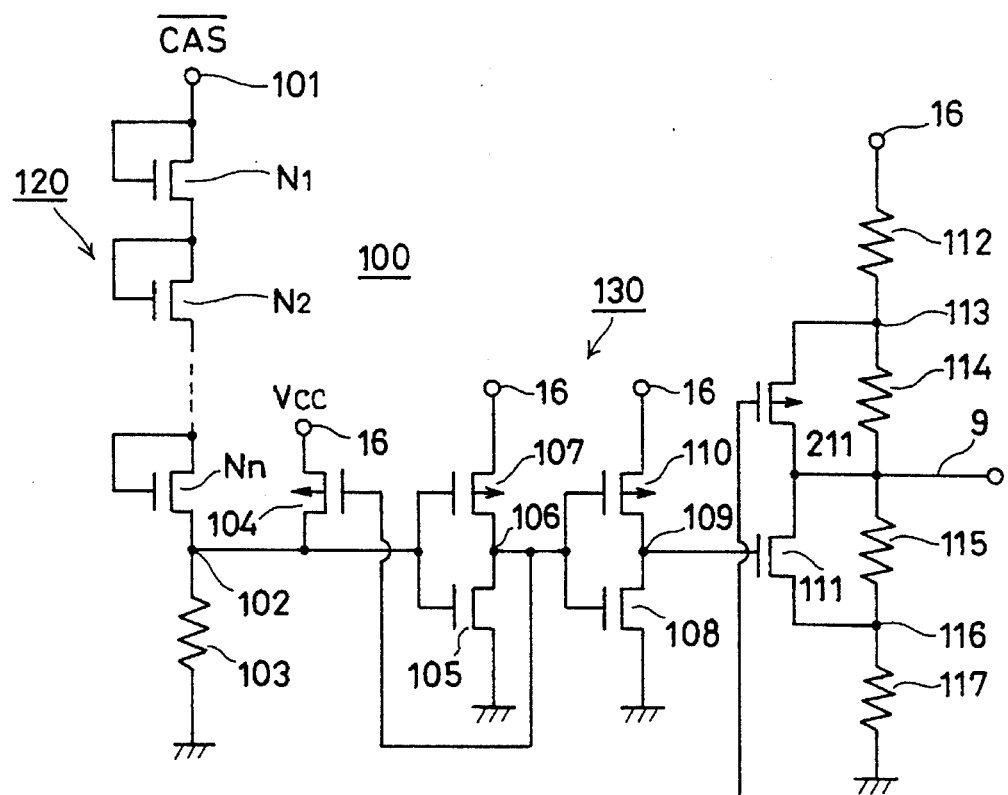
FIG. 2 is an electric circuit diagram of one embodiment of the present invention.
Figure 2:
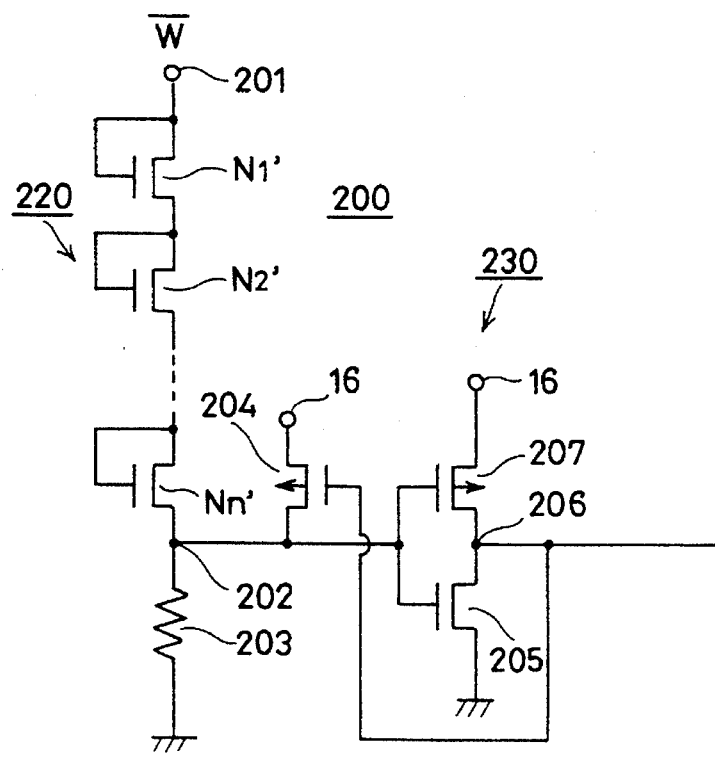

FIG. 2 is a concrete electric circuit diagram of the test circuit shown in FIG. 1. Referring to FIG. 2, a structure of the test circuit will be described. An arbitrary external input signal (for example, $\overline{CAS}$ signal) of the DRAM is applied to an input terminal 101 of the circuit 100. As an external input signal, for example, an I/O signal may be applied. A voltage detection circuit 120 is connected to the input terminal 101. The voltage detection circuit 120 comprises a plurality of n channel MOS transistors N1, N2, Nn connected in series, each transistor having a drain and a gate electrode connected to each other.

A source of the n channel MOS transistor Nn in the last stage is grounded by a resistance 103 having a relatively high resistance value. A voltage switching circuit 130 is connected to a node 102 between the n channel MOS transistor Nn and the resistance element 103. More specifically, a source of a p channel MOS transistor 104, a gate electrode of a p channel MOS transistor 107 and a gate electrode of an n channel MOS transistor 105 which are included in the voltage switching circuit 130 are connected to the node 102. The p channel MOS transistor 107 and the n channel MOS transistor 105 are connected in series between a power supply terminal 16 and a ground to form an inverter circuit. The p channel MOS transistor 104 has a drain connected to the power supply terminal 16 and a gate electrode connected to a node 106 which is an output point of the inverter circuit comprising the p channel MOS transistor 107 and the n channel MOS transistor 105.

Gate electrodes of a p channel MOS transistor 110 and an n channel MOS transistor 108 are connected to the node 106. The p channel MOS transistor 110 and the n channel MOS transistor 108 are connected in series between the power supply terminal 16 and the ground to form an inverter circuit. A gate electrode of an n channel MOS transistor 111 is connected to a node 109 which is an output end of the inverter circuit. The n channel MOS transistor 111 has a drain connected to a bit line voltage supply line 9 and a source connected to a a node 116. The bit line voltage supply line 9 is connected to a node between resistances 112 and 114, and 115 and 117 constituting a constant voltage circuit connected between the power supply terminal 16 and the ground.

The circuit 200 is provided for testing an operation margin for the data "1" of a memory cell. A voltage detection circuit 220 included in the circuit 200 is structured in the same manner as the above described voltage detection circuit 120, and comprises a plurality of n channel MOS transistors $N_1'$, $N_2'$ ... Nn' and a resistance element 203. A voltage switching circuit 230 comprises p channel MOS transistors 204 and 207 and an n channel MOS transistor 205. The p channel MOS transistor 207 and the n channel MOS transistor 205 are connected between the power supply terminal 16 and the ground to form an inverter circuit. A node 206 which is an output end of the inverter circuit is connected to a gate electrode of a p channel MOS transistor 211, which has a source connected to a node 113 and a drain connected to the bit line voltages supply line 9.

Now, an operation of the electric circuit shown in FIG. 2 will be described. Now, assuming that the threshold voltage ($V_{TH}$) of the MOS transistor is 0.5 V and N=13, as long as no voltage higher than 0.5 V×13=6.5 V is applied between the input terminal 101 and the node 102, none of the n channel MOS transistors $N_1, N_2 \ldots$ Nn become conductive. The maximum value of the "H" level of the input signal of the DRAM is defined as 6.5 V. In a normal operation, the node 102 is grounded by the resistance element 103 and attains the "L" ("low") level. Consequently, the p channel MOS transistor 107 becomes conductive, so that the node 106 attains the "H" level, and the n channel MOS transistor 108 becomes conductive, so that the node 109 attains the "L" level. Therefore, the n channel MOS transistor 111 becomes non-conductive and if the transistor 211 is turned off, the bit line voltage becomes ½·Vcc.

When a voltage at the input terminal 101 is set higher than 6.5 V, for example, at 10 V, a voltage of about 10 V−6.5 V=3.5 V is generated across the node 102. Consequently, the n MOS transistor 105 becomes conductive and the node 106 attains the "L" level, thereby rendering the p channel MOS transistor 104 conductive, raising the node 102 to the level of the power supply voltage Vcc, rendering the p channel MOS transistor 107 non-conductive and the n channel MOS transistor 105 conductive. As a result, the node 106 attains a "L" level, the p channel MOS transistor 110 becomes conductive, the n channel MOS transistor 108 becomes non-conductive and the node 109 attains the level of the power supply voltage Vcc. Furthermore, the n channel MOS transistor 111 becomes conductive, and since the resistance 114 is set at a relatively high value for reducing a power consumption and the conductive resistance of the n channel MOS transistor 111 is set at a low value, a voltage drop between the bit line voltage supply line 9 and the node 116 becomes approximately 0 V and a bit line voltage becomes lower than ½·Vcc.

Namely, the operation margin for the data "0" of the memory cell 1 can be tested. If a separate terminal is provided for the test, the above described process is not required. However, in a DRAM requiring high density packing, the number of terminals should be as small as possible. Therefore, in general no test terminal is provided. According to the embodiment of the present invention, the test becomes possible without providing a test terminal.

Although in some cases a $\overline{CAS}$ input signal is applied in pulses and the voltage thereof becomes 0 V, even in such a case, a level of the node 102 is maintained at the level of the power supply voltage Vcc by the p channel MOS transistor 104, enabling a desired test.

On the other hand, in order to release the test state, the power supply voltage should be brought temporarily to 0 V and the transistors 104, 105 and 107 should be reset. By doing so, the level of the node 102 becomes the ground level, enabling a normal operation.

When a $\overline{W}$ input signal having a voltage higher than the normal operation range is externally applied to an input terminal 201 of the voltage detection circuit 220, the n channel MOS transistors $N_1', N_2' \ldots N_n'$ become conductive and a node 202 attains the "H" level. The "H" level is inverted by the p channel MOS transistor 207 and the n channel MOS transistor 205, and the node 206 attains the "L" level. Consequently, the p channel MOS transistor 211 becomes conductive so that a bit line voltage is set to be larger than ½·Vcc. Although in this embodiment three types of values are provided for a bit line voltage, the value is not limited to these, but any other types of voltages may be provided for evaluating a performance.

Figure 3:
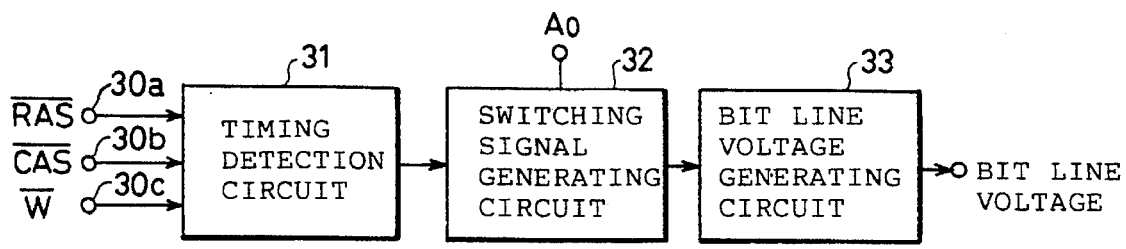
FIG. 3 is a schematic block diagram showing another embodiment of the present invention.

The embodiment shown in FIG. 3 is for generating a bit line voltage in accordance with a condition of an input timing, for which a timing detection circuit 31 is provided and a $\overline{RAS}$ signal, a $\overline{CAS}$ signal and a $\overline{W}$ signal are applied thereto. The timing detection circuit 31 applies a test signal T to a switching signal generating circuit 32 if the $\overline{CAS}$ signal and the $\overline{W}$ signal are at the "L" level when the $\overline{RAS}$ signal falls to the "H" level. An address signal $A_0$ is applied to the switching signal generating circuit 32. The switching signal generating circuit 32 switches a bit line voltage outputted from a bit line voltage generating circuit 33 in response to the test signal T and the address signal $A_0$.

Figure 4:
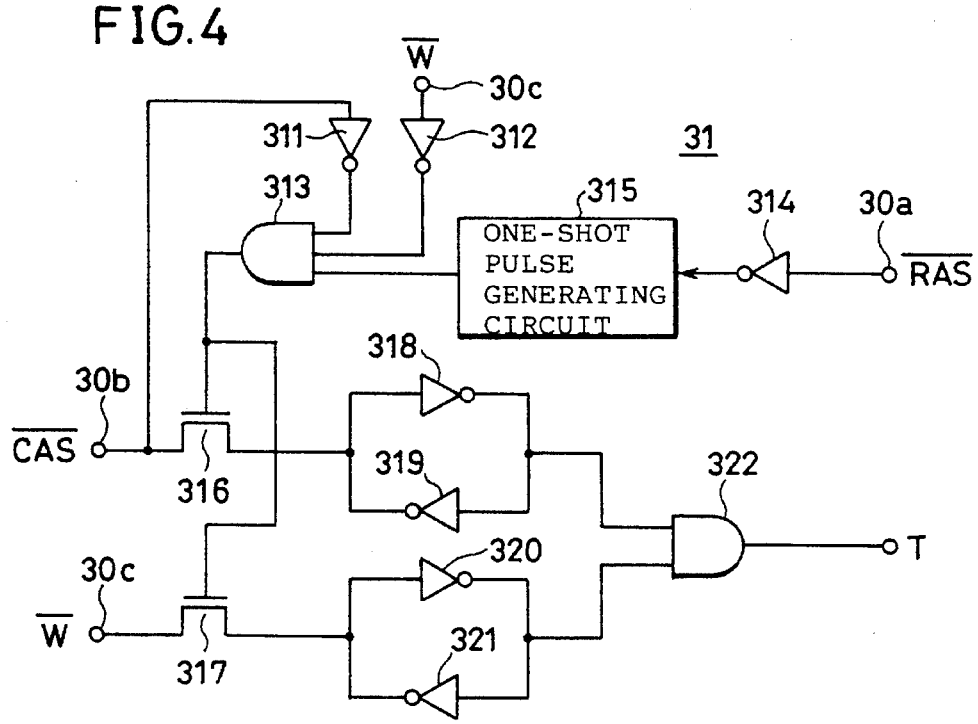
FIG. 4 is a circuit diagram of a timing detection circuit shown in FIG. 3.
Figure 5:
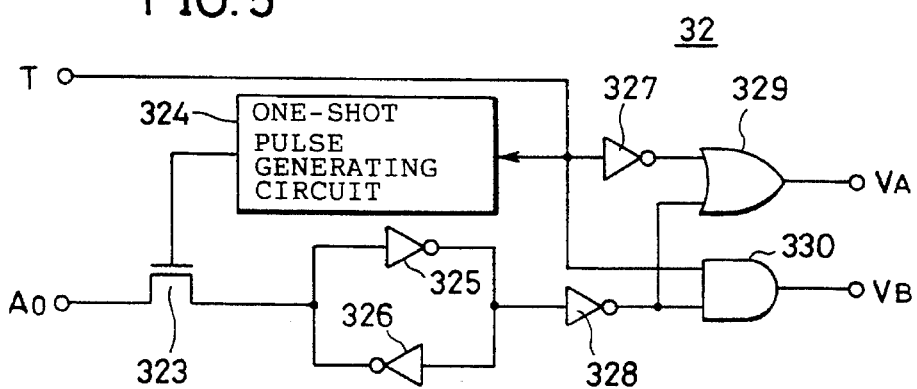
FIG. 5 is a circuit diagram showing a switching signal generating circuit shown in FIG. 3.

Now referring to FIGS. 4 to 6, a more detailed structure of another embodiment of the present invention will be described. Referring to FIG. 4, a $\overline{CAS}$ signal is applied to an inverter 311 and is inverted, and an output thereof is applied to one of input terminals of a 3-input AND gate 313 and to a drain of an n channel MOS transistor 316. A $\overline{W}$ signal is applied to an inverter 312 and is inverted, then the inverted W signal is inputted to the AND gate 313, and is applied to a drain of an n channel MOS transistor 317.

A $\overline{RAS}$ signal is applied to an inverter 314 and is inverted to be applied to an one-shot pulse generating circuit 315. The one-shot pulse generating circuit 315 generates an one-shot pulse at a timing of the fall of the $\overline{RAS}$ signal and applies the same to the AND gate 313. An output of the AND gate 313 is applied to gates of the n channel MOS transistors 316 and 317. A source of the n channel MOS transistor 316 is connected to an input of a latch circuit comprising inverters 318 and 319, and a source of the n channel MOS transistor 317 is connected to an input of a latch circuit comprising inverters 320 and 321. Each output of the latch circuits is inputted to an AND gate 322, and a test signal T is outputted from an output of the AND gate 322.

Now referring to FIG. 5, a structure of the switching signal generating circuit 32 will be described. A test signal T is applied to a one-shot pulse generating circuit 324 and one input terminal of an AND gate 330, and is also inverted by an inverter 327 to be applied to one input terminal of an OR gate 329. The one-shot pulse generating circuit 324 generates a one-shot pulse in response to the test signal T to apply the same to a gate of an n channel MOS transistor 323. An address signal $A_0$ is applied to a drain of the n channel MOS transistor 323. A source of the n channel MOS transistor 323 is connected to an input terminal of a latch circuit comprising inverters 325 and 326. An output of the latch circuit is inverted by an inverter 328 and is applied to the other input of the OR gate 329 and the other input terminal of the AND gate 330. The OR gate 329 outputs a $V_A$ signal from its output terminal and the AND gate 330 outputs a $V_B$ signal from its output.

Now, referring to FIG. 6, the bit line voltages generating circuit 33 will be described. The bit line voltage generating circuit 33 comprises a p channel MOS transistor 211, an n channel MOS transistor 111, and resistances 112, 114, 115 and 117. The p channel MOS transistor 211 and the n channel MOS transistor 111 are connected in series between nodes 113 and 116. The $V_A$ signal outputted from the switching signal generating circuit 32 is applied to a gate of the p channel MOS transistor 211, and the $V_B$ signal is applied to a gate of the n channel MOS transistor 111. The resistance 112, the p channel MOS transistor 211, the n channel MOS transistor 111 and the resistance 117 are connected in series between the power supply and the ground, and the resistances 114 and 115 are connected in series in parallel arrangement with respect to the p channel MOS transistor 211 and the n channel MOS transistor 111. A bit line voltage is outputted from a node of the resistances 114 and 115.

Figure 7:
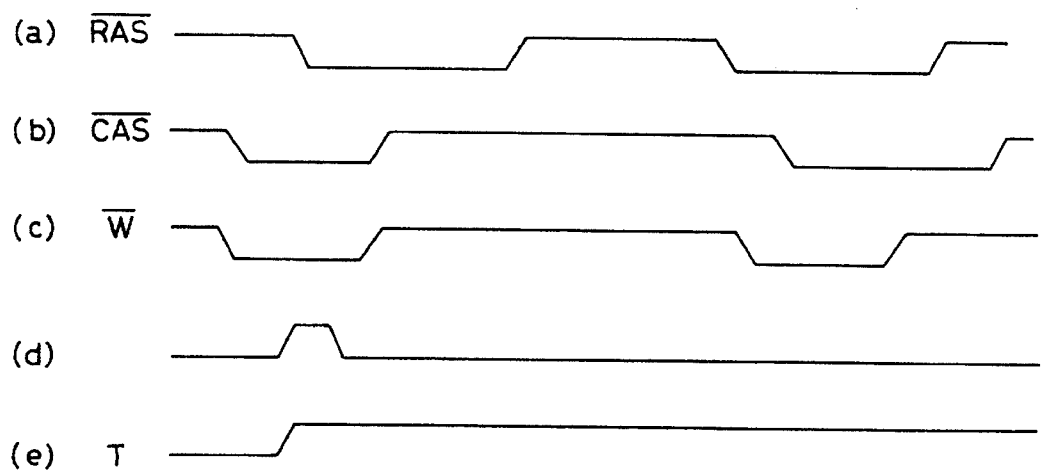
FIG. 7 is a timing diagram for explaining an operation of another embodiment of the present invention.

FIG. 7 is a timing diagram for explaining an operation of the timing detection circuit shown in FIG. 4.

Now referring to FIGS. 4 to 7, an operation of another embodiment of the present invention will be described. When the power supply is turned on, each output of latch circuits structured by the inverters 318 and 319, 320 and 321 in the timing detection circuit 31, respectively, is set so as to automatically be the "L" level. Accordingly, the output of the AND gate 322 receiving the outputs of the latch circuits is at the "L" level. Since this state is maintained by the latch circuits, the test signal T is at the "L" level in a normal operation.

This state moves to a test state when the $\overline{CAS}$ signal and the $\overline{W}$ signal attain the "L" level at a fall of the $\overline{RAS}$ signal. More specifically, as shown in FIG. 7(a), when the $\overline{RAS}$ signal falls, it is inverted by the inverter 314, and the one-shot pulse generating circuit 315 generates a one-shot pulse signal as shown in FIG. 7(d) and applies the same to the AND gate 313. At this time, as shown in FIGS. 7(b) and (c), if both of the $\overline{CAS}$ signal and the $\overline{W}$ signal are at the "L", they are inverted by the inverters 311 and 312, respectively, so that the AND gate 313 is enabled. As a result, the one-shot pulse is applied to the n channel MOS transistors 316 and 317 to be rendered conductive.

The conduction of the n channel MOS transistors 316 and 317 causes the $\overline{CAS}$ signal and $\overline{W}$ signal at the "L" level to be applied to the latch circuits comprising the inverters 318 and 319, and the inverters 320 and 321, respectively. As a result, the outputs of the respective latch circuits are inverted, so that the "H level signal is applied to the AND gate 322. Accordingly, the test signal T which is an output of the AND gate 322 attains the "H" level to enter a test state.

Thereafter, since the timing conditions of the $\overline{RAS}$ signal, the $\overline{CAS}$ signal and the $\overline{W}$ signal become a normal condition, the above described conditions are not satisfied, whereby the n channel MOS transistors 316 and 317 are not rendered conductive, so that no latch circuit is inverted and a level of the test signal T is maintained at the "H" level, maintaining a test state.

As described above, when the test signal T attains the "H" level, an one-shot pulse is generated from the one-shot pulse generating circuit 324 of the switching signal generating circuit 32 shown in FIG. 4, to render the n channel MOS transistor 323 conductive. As a result, the address signal $A_0$ is applied to the latch circuit comprising the inverters 325 and 326. When the address signal $A_0$ is at the "L" level, the output of the latch circuit attains the "H" level, and the output of the inverter 328 attains the "L" level. The test signal T of the "H" level is inverted by the inverter 327 and is applied to the OR gate 329, and the output of the inverter 328 is at the "L" level, so that the OR gate 329 outputs the $V_A$ signal of the "L" level and the AND gate 330 outputs the $V_B$ signal of the "L" level.

Figure 6:
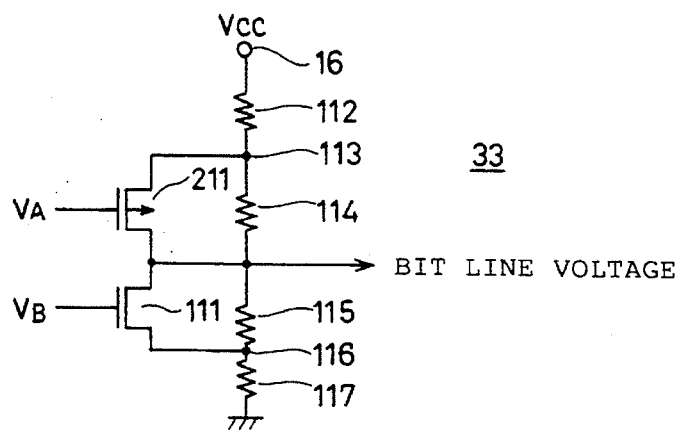
FIG. 6 is a circuit diagram showing a bit line voltages generating circuit shown in FIG. 3.

The $V_A$ signal of the "L" level is applied to the gate of the p channel MOS transistor 211 of the bit line voltage generating circuit 33 shown in FIG. 6, and the $V_B$ signal is applied to the gate of the n channel MOS transistor 111. Accordingly, the p channel MOS transistor 211 becomes conductive and the n channel MOS transistor 111 becomes non-conductive. As a result, a bit line voltage higher than ½·Vcc is outputted.

If the address signal $A_0$ attains the "H" level, the output of the latch circuit becomes the "L" level and the output of the inverter 328 attains the "H" level, so that the $V_A$ signal which is the output of the OR gate 329 attains the "H" level and the $V_B$ signal which is the output of the AND gate 330 attains the "H" level. As a result, the p channel MOS transistor 211 of the bit line voltage generating circuit 33 becomes non-conductive and the n channel MOS transistor 111 becomes conductive, whereby the bit line voltage becomes lower than ½·Vcc.

In a normal operation, since the test signal T is at the "L" level, the $V_A$ signal is at the "H" level and the $V_B$ signal is at the "L" level, so that neither the p channel MOS transistor 211 nor the n channel MOS transistor 211 is rendered conductive, whereby a voltage of ½·Vcc divided by the resistances 112 and 114, and 115 and 117 is outputted.

As described above, the cell plate voltages shown in the following table are generated on the input conditions.

TABLE

| | T | $A_0$ | $V_A$ | $V_B$ | bit line voltage |
|---|---|---|---|---|---|
| Normal operation | "L" | "L" | "H" | "L" | ½ · Vcc |
| | | "H" | "H" | "L" | ½ · Vcc |
| Test | "H" | "L" | "L" | "L" | ½ · Vcc − ΔV |
| | | "H" | "H" | "H" | ½ · Vcc + ΔV |

Figure 8:
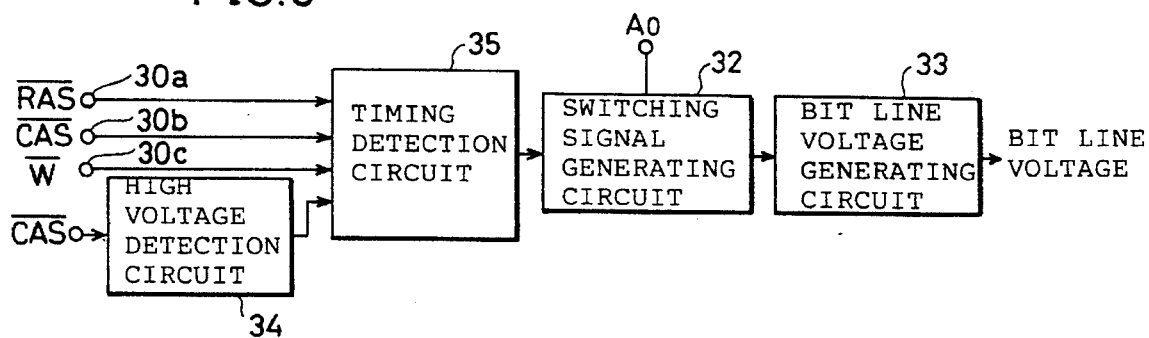
FIG. 8 is a schematic block diagram showing a further embodiment of the present invention.

The embodiment shown in FIG. 8 is for setting a test state by combining a high voltage detection circuit 34 and a timing detection circuit 35. More specifically, the high voltage detection circuit 34 detects a high voltage being applied as the $\overline{CAS}$ signal. The timing detection circuit 35, in the same manner as the embodiment shown in FIG. 3, detects the $\overline{CAS}$ signal and the $\overline{W}$ signal being at the "L" level at a fall of the $\overline{RAS}$ signal and generates the test signal T in response to the detection of the high voltage by the high voltage detection circuit 34. The switching signal generating circuit 32 and the bit line voltage generating circuit 33 are the same as those of the embodiment shown in FIG. 3.

Figure 9:
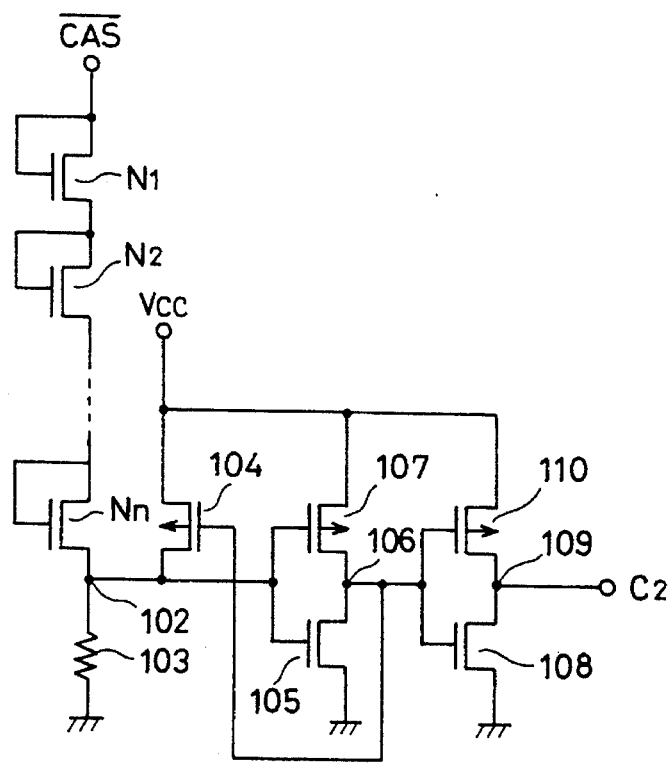
FIG. 9 is a circuit diagram of a high voltage detection circuit shown in FIG. 8.
Figure 10:
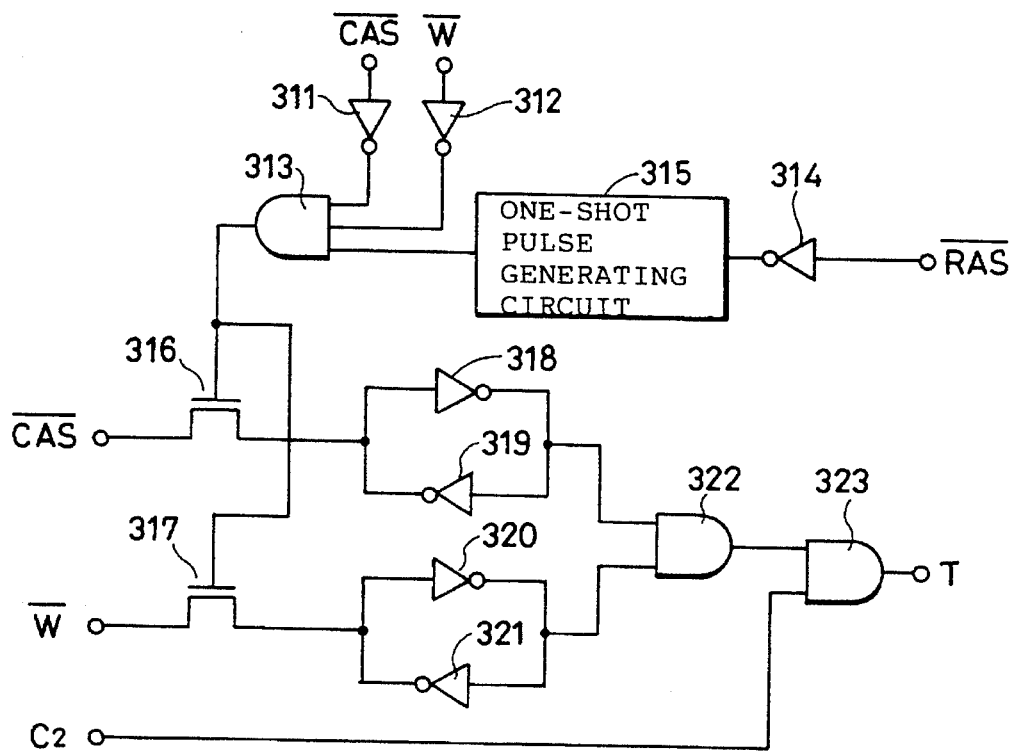
FIG. 10 is a circuit diagram of a timing detection circuit shown in FIG. 8.
Figure 11:
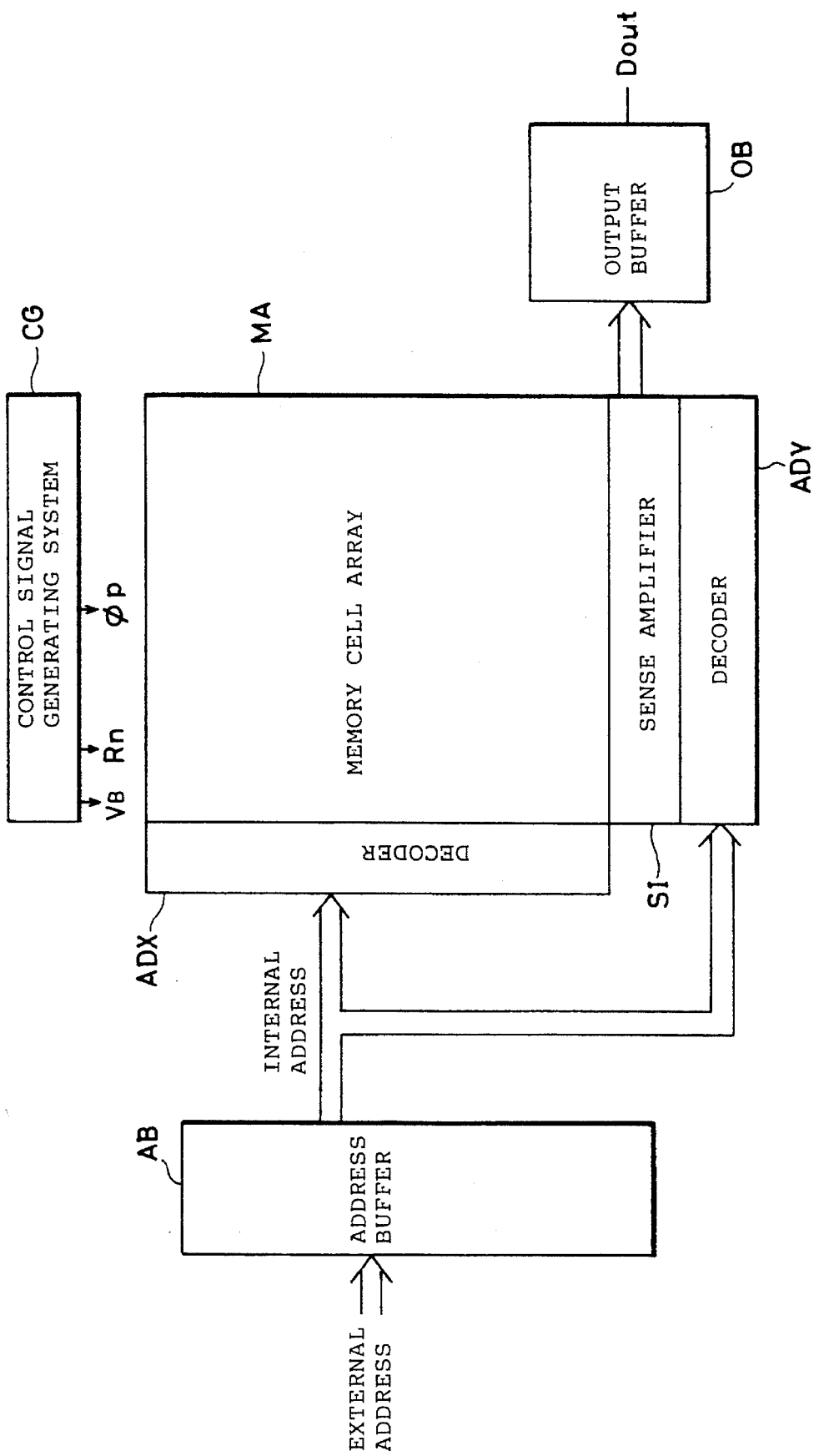
FIG. 11 is a schematic block diagram showing an entire structure of a reading portion of a conventional DRAM.
Figure 12:
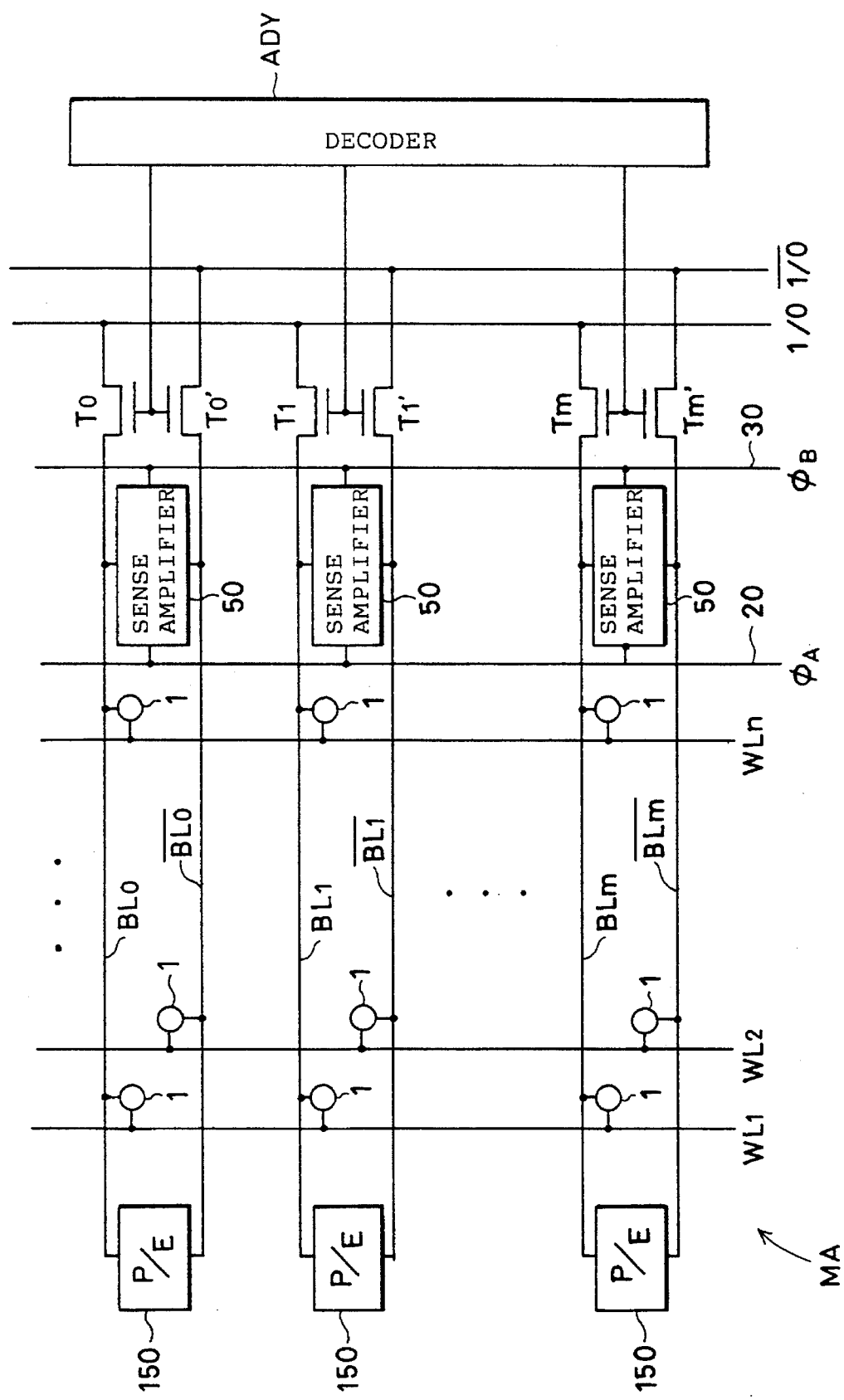
FIG. 12 is a schematic diagram of a structure of a memory cell array shown in FIG. 11.

Now referring to FIGS. 9 and 10, a more detailed structure of still another embodiment of the present invention will be described. The high voltage detection circuit 34 comprises n channel MOS transistors $N_1, N_2 \ldots Nn$, 105 and 108, p channel MOS transistors 104, 107 and 110 and a resistance 103 as FIG. 2. As shown in FIG. 9, the timing detection circuit 35 is structured in the same manner as that of FIG. 4 except that an AND gate 323 is provided to which the output of the AND gate 322 and a detection signal C2 from the high voltage detection circuit 34 are inputted.

Now, an operation of still another embodiment of the present invention will be described. Referring to FIG. 9, in the high voltage generating circuit 34, when the $\overline{CAS}$ signal of high voltage is not applied, for example, if the $\overline{CAS}$ signal is less than 6.5 V, the p channel MOS transistor 107 becomes conductive, so that the "H" level signal is applied to the n channel MOS transistor 108 in the same manner as described with reference to FIG. 2, whereby the n channel MOS transistor becomes conductive and the output signal C2 attains the "L" level.

When the $\overline{CAS}$ signal having a voltage more than 6.5 V, for example, a voltage of 10 V, is applied, a voltage of 3.5 V is generated at a node 102, the n channel MOS transistor 105 becomes conductive and a node 106 attains the "L" level. As a result, the p channel MOS transistor 104 becomes conductive, a potential level of the node 102 is raised up to the power supply voltage Vcc, so that the p channel MOS transistor 107 becomes non-conductive and the n channel MOS transistor 105 becomes conductive. Consequently, the node 106 attains a complete "L" level, the p channel MOS transistor 110 becomes conductive, and the n channel MOS transistor 108 becomes non-conductive, whereby a node 109 attains the "H" level. Accordingly, the detection signal C2 of the "H" level is applied from the high voltage detection circuit 34 to the AND gate 323 included in the timing detection circuit 35. In addition, the timing detection circuit 35 applies the "H" level signal from the output of the AND gate 322 to the AND gate 323 if the $\overline{CAS}$ signal and the $\overline{W}$ signal are at the "L" level at a time of fall of the $\overline{RAS}$ signal, in the same manner as described with reference to FIG. 4. As a result, the test signal T of the "H" level is applied to the switching signal generating circuit 32 from the AND gate 323. The switching signal generating circuit 32 generates a bit line voltage from the bit line voltage generating circuit 33 in the same manner as described with reference to FIG. 4.

As described in the foregoing, according to the embodiments of the present invention, a first voltage higher than a voltage of a normal use and a second voltage lower than the first voltage are applied to one electrode of a memory cell transistor, so that a memory cell having a small margin can be tested in a short period of time. As described above, these voltages are not limited to one for a higher voltage and the other for a lower voltage, but other kinds of voltages can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test circuit, comprising:

a plurality of bit lines;

a plurality of memory cells each including one insulated gate field effect transistor and one capacitance, each insulated gate field effect transistor being connected to a corresponding bit line;

a plurality of input terminals for receiving control signals from an external source;

test mode detecting means operatively connected to said input terminals and responsive to the control signals applied to said input terminals for detecting test mode conditions under which testing of said memory cells is carried out;

voltage switching controlling means responsive to the detection of a test mode by said test mode detecting means for switching between circuit configurations;

voltage generating means, responsive to said voltage switching control means, for generating a first voltage lower than normal operating voltage of said memory cells and a second voltage higher than normal operating voltage of said memory cells; and means for applying said first and said second voltages to a corresponding bit line.

2. A semiconductor memory device having a test circuit according to claim 1, wherein said test mode detecting means comprises circuit means responsive to a voltage higher than voltage applied to said input terminals during normal memory cell operation, for detecting voltage indicative of said test mode.

3. A semiconductor memory device having a test circuit according to claim 2, wherein said circuit means for detecting voltage comprises:
a first series circuit having a plurality of first MOS transistors and a first resistance, connected in series between one of said input terminals and a first reference potential;
a second series circuit of a plurality of second MOS transistors and a second resistance connected in series between another of said input terminals and the first reference potential; and
said voltage switching controlling means comprises means for generating a first output voltage in conjunction with said voltage generating means, in response to a second predetermined voltage at a node between a first MOS transistor and said first resistance, and for generating said second voltage in conjunction with said voltage generating means, in response to a second predetermined voltage at a node between a second MOS transistor and said second resistance.

4. A semiconductor memory device having a test circuit according to claim 1, wherein said test mode detecting means comprises timing detecting means responsive to a control signal being inputted to at least one of said input terminals at a different timing of signals at said input terminals from that used during normal operation of said memory cells for detecting said test mode, and said voltage switching means comprises means responsive to a detection of a first timing of signals at said input terminals by said timing detecting means for switching to generate said first voltage in conjunction with said voltage generating means, and responsive to a detection of a second timing of signals at said input terminals for switching to generate said second voltage.

5. A semiconductor memory device having a test circuit according to claim 1, wherein said test mode detecting means comprises means for detecting said test mode, in response to a control signal being inputted to any one of said input terminals at a different timing of signals at said input terminals from that used during normal operation of said memory cells and a voltage higher than normal operating voltage of said memory cells being applied to another of said input terminals, and said voltages switching means comprises means for switching to generate said first voltage from said voltage generating means in response to an application of said voltage higher than normal operating voltage by said test mode detecting means and a detection of a first timing of signals at said input terminals, and for generating said second voltage in response to a detection of a second timing of signals at said input terminals.

6. A semiconductor memory device having a test circuit according to claim 1, wherein said voltage generating means comprises:
a first resistance connected between a first reference potential and a first node; and
a second resistance connected between said bit line and said first node,
and wherein said voltage switching controlling means comprises a switching element connected in parallel to said second resistance at said bit line and said first node, said switching element remaining non-conductive under conditions of normal memory cell use and becoming conductive in response to a detection of test mode conditions by said test mode detecting means, said switching element applying said second voltage from said first node to said bit line by shorting said second resistance.

7. A semiconductor memory device having a test circuit according to claim 6, wherein said voltage generating means further comprises:
a third resistance connected between a second node and said bit line, and
a fourth resistance connected between said second node and a second reference potential,
said voltage switching controlling means comprises a switching element connected in parallel to said third resistance and remaining non-conductive under conditions of normal memory cell use, and becoming conductive in response to a detection of the test mode by said test mode detecting means to apply said first voltage from said second node to said bit line by shorting said third resistance.

8. A semiconductor memory device having a test circuit, comprising:

a plurality of bit lines;
a plurality of memory cells, each including a single transistor and a single capacitance, said transistor being connected to a corresponding bit line;
voltage generating means for generating a voltage to be applied to said bit lines;
means for detecting first and second test mode enable signals for controlling a test mode of said memory device;
means responsive to absence of said first and second test enable signals for controlling said voltage generating means to apply a normal operating voltage of said memory cells to said bit lines;
means responsive to the presence of said
first test enable signal for applying a voltage higher than said normal operating voltage to a corresponding bit line; and,
means responsive to the presence of said second test enable signal for applying a voltage lower than said normal operating voltage to a corresponding bit line.

9. A semiconductor memory device having a test circuit, said memory device comprising:

a plurality of bit lines;

a plurality of memory cells, each comprising a transistor and a data storage capacitance, said transistor being connected to a corresponding bit line;

sources of first and second reference voltages to be operatively connected to said bit line;

means for detecting first and second test enable signals for controlling a test mode of said memory device;

voltage generating means for generating a third reference voltage to be applied to an electrode of a selected transistor, said third reference voltage having a value between those of said first and second reference voltages to be applied to a bit line corresponding to said selected transistor;

means responsive to absence of said first and second test enable signals for controlling said voltage generating means to apply a normal operating voltage of said memory cells to said corresponding bit line;

means responsive to the presence of said first test enable signal for applying a voltage higher than said normal operating voltage to a corresponding bit line; and, means responsive to the presence of said second test enable signal for applying a voltage lower than said normal operating voltage to a corresponding bit line.

10. A method of operating a semiconductor memory device having a test circuit, said semiconductor memory device comprising sources of first and second reference voltages, a plurality of bit lines, a plurality of memory cells, each memory cell comprising a transistor connected to a corresponding bit line and a data storage capacitance, intermediate potential generating means for applying to a plate of said data storage capacitance a third reference voltage intermediate said first and second reference voltages, and voltage generating means for generating an operating voltage to be applied to said bit lines, said method comprising the steps of:

detecting for first and second testing mode enable signals for controlling a test mode of said memory device;

in response to the absence of said first and second testing mode enable signals, applying a normal operating voltage of said memory cells to a corresponding bit line;

in response to the presence of said first testing mode enable signal, applying a voltage higher than said normal operating voltage of said memory cells to a corresponding bit line; and, in response to the presence of said second testing mode enable signal, applying a voltage lower than said normal operating voltage of said memory cell to a corresponding bit line.

11. A semiconductor memory device, comprising:

a memory cell having an insulating gate type field effect transistor having a first main electrode connected to a corresponding bit line and a gate electrode connected to a corresponding word line, and a capacitance having a first electrode connected to a second main electrode of the insulating gate type field effect transistor;

an intermediate potential generating means for applying an intermediate potential between a power supply potential and a ground potential to an output node connected to a second electrode of the capacitance in the memory cell; and a bit line potential applying means responsive to first and second test mode enable signals for applying to a corresponding bit line the intermediate potential between the power supply potential and the ground potential in a normal operation, a potential higher than the potential of said normal operation upon receiving the first test mode enable signal, and a potential lower than the potential of said normal operation upon receiving the second test mode enable signal.

12. A test circuit of a semiconductor memory device including a memory cell having an insulating gate type field effect transistor having a first main electrode connected to a corresponding bit line and a gate electrode connected to a corresponding word line, and a capacitance having a first electrode connected to a second main electrode of the insulating gate type field effect transistor, and an intermediate potential generating means for applying an intermediate potential between a power supply potential and a ground potential to a first output node connected to a second electrode of the capacitance in the memory cell, said test circuit comprising:

a bit line potential applying means having an intermediate potential generating portion having a second output node for generating a potential for being applied to a corresponding bit line, a first resistance element connected between the second output node and a power supply potential node to which said power supply potential is applied, and a second resistance element connected between said second output node and a ground potential node to which said ground potential is applied, for applying an intermediate potential between said power supply potential and said ground potential to said second output node, and a first transistor connected in parallel to said first resistance element and a second transistor connected in parallel to said second resistance element, for providing an intermediate potential from said intermediate potential generating portion to said second output node with said first and second transistors rendered non-conductive in a normal operation, for providing to said second output node a potential higher than the intermediate potential from said intermediate potential generating portion with said first transistor rendered conductive and said second transistor rendered non-conductive in a first test mode, and for providing to said second output node a potential lower than the intermediate potential from said intermediate potential generating portion with said first transistor rendered non-conductive and said second transistor rendered conductive in a second test mode.

13. A test circuit for a semiconductor memory device including a memory cell having an insulating gate type field effect transistor having a first main electrode connected to a corresponding bit line and a gate electrode connected to a corresponding word line, and a capacitance having a first electrode connected to a second main electrode of the insulating gate type field effect transistor, and an intermediate potential generating means for applying an intermediate potential between a power supply potential and a ground potential to a first output node connected to a second electrode of the capacitance in the memory cell, said test circuit comprising:

a bit line potential applying means having an intermediate potential generating portion having a second output node for generating a potential for being applied to a corresponding bit line, a first resistance element connected between said second output node and a power supply potential node to which said power supply potential is applied, and a second resistance element connected between said second output node and a ground potential node to which said ground potential is applied, for applying an intermediate potential between said power supply potential and said ground potential to said second output node, and a transistor connected in parallel to said second resistance element, for providing to said second output node an intermediate potential from said intermediate potential generating portion with said transistor rendered non-conductive in a normal operation, and for providing to said second output node a potential lower than the intermediate potential from said intermediate potential generating portion with said transistor rendered conductive in a test mode.

* * * * *